United States Patent [19]

Miyashita et al.

[11] Patent Number: 5,111,272
[45] Date of Patent: May 5, 1992

[54] SEMICONDUCTOR DEVICE HAVING ELEMENT REGIONS ELECTRICALLY ISOLATED FROM EACH OTHER

[75] Inventors: Naoto Miyashita, Yokohama; Koichi Takahashi, Kawasaki; Hironori Sonobe; Mitsutoshi Koyama, both of Tokyo, all of Japan

[73] Assignee: Kabushiki Kaisha Toshiba, Kawasaki, Japan

[21] Appl. No.: 651,988

[22] Filed: Feb. 7, 1991

[30] Foreign Application Priority Data

Feb. 9, 1990 [JP] Japan ................................. 2-30584

[51] Int. Cl.[5] .............................................. H01L 27/12
[52] U.S. Cl. ........................................ 357/49; 357/47; 357/50
[58] Field of Search ............................ 357/47, 49, 50

[56] References Cited

U.S. PATENT DOCUMENTS 4,631,803 12/1986 Hunter et al. ............................. 357/5
4,746,963 5/1988 Uchida et al. ........................... 357/47
4,799,099 1/1989 Verret et al. ............................ 357/47

Primary Examiner—Rolf Hille
Assistant Examiner—Roy Potter
Attorney, Agent, or Firm—Finnegan, Henderson, Farabow, Garrett, and Dunner

[57] ABSTRACT

A semiconductor device of this invention is characterized in that one element region is electrically isolated from another element region adjacent thereto by forming a groove surrounding the one element region and a distance between the groove surrounding one element region and a groove surrounding the another element region is set to be equal to or larger than 3 $\mu$m.

6 Claims, 6 Drawing Sheets

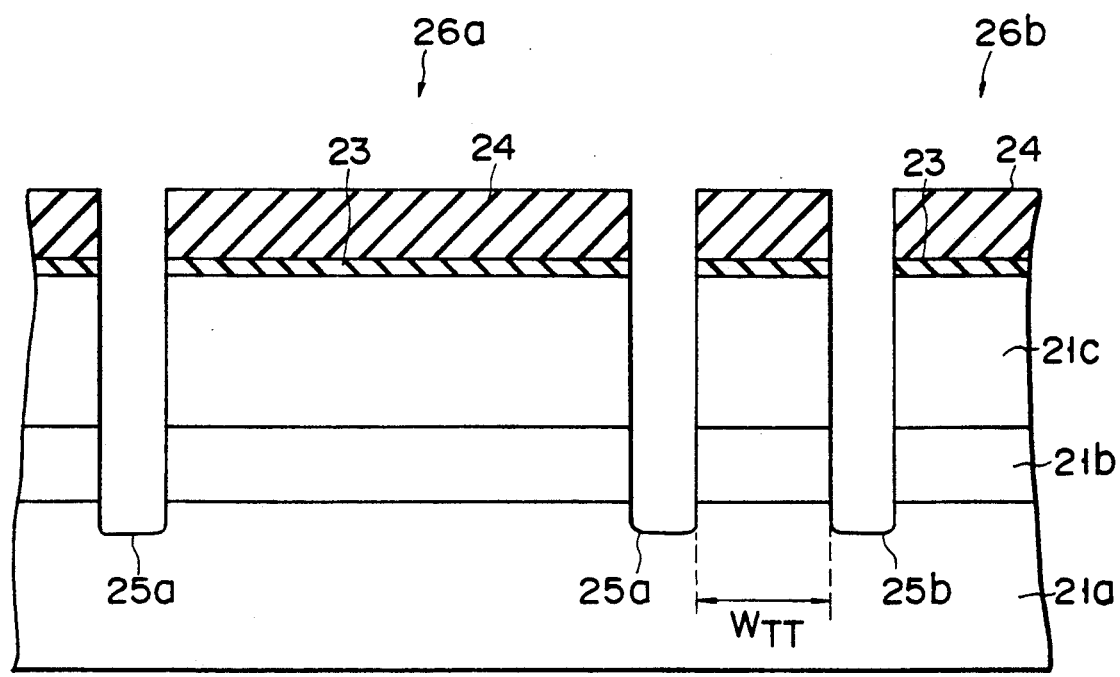
F I G. 4 A
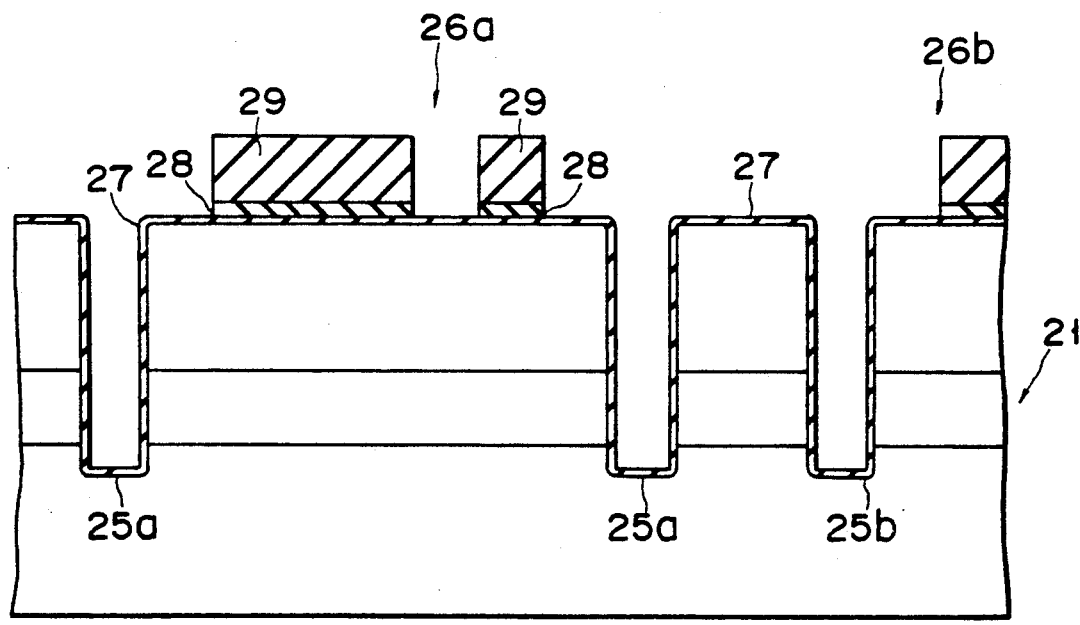
F I G. 4 B

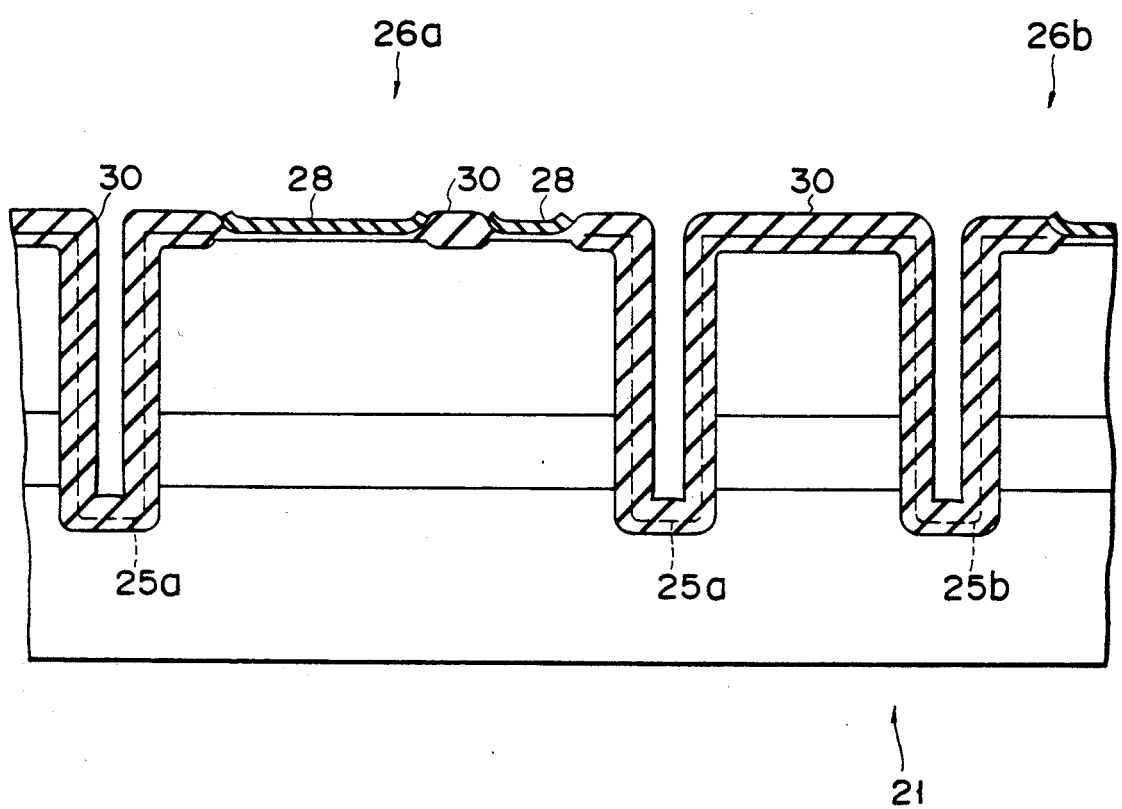
F I G. 4C

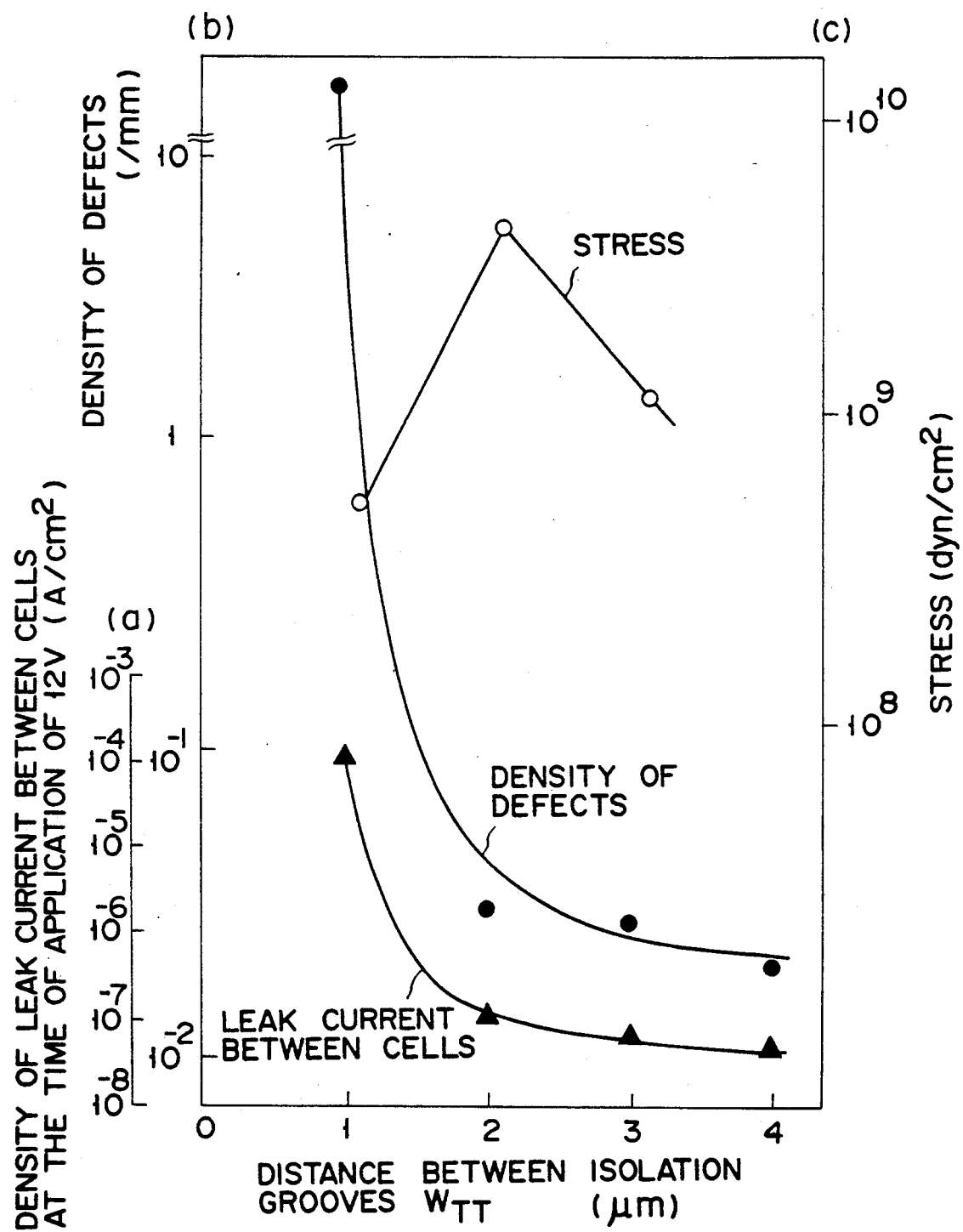
F I G. 5

SEMICONDUCTOR DEVICE HAVING ELEMENT REGIONS ELECTRICALLY ISOLATED FROM EACH OTHER

BACKGROUND OF THE INVENTION

1. Field of the Invention

This invention relates to an improvement in a semiconductor device, and more particularly to an improvement in a technique for isolation between element regions.

2. Description of the Related Art

In general, in a semiconductor integrated circuit, a plurality of element regions which are electrically isolated from one another are formed in the main surface of a semiconductor substrate and active elements and passive elements are formed in the element regions.

As a method of isolating the element regions from one another, an isolation technique using PN junctions, an isolation technique using oxide films, and an isolation technique using grooves are known. The conventional semiconductor device and the method for manufacturing the same are explained below by using the isolation technique using oxide films as an example. FIG. 1 shows the conventional semiconductor integrated circuit in which the isolation technique using the oxide films is used.

In a silicon substrate 1, element regions 2a, 2b, ... are formed. The element regions 2a, 2b, ... are surrounded by grooves 3a, 3b, .... An oxide film 4 is formed on the field region and the internal surfaces of the grooves 3a, 3b, .... Polysilicon layers 5 are buried in the grooves 3a, 3b, ... in which the oxide film 4 is formed. Thin cap oxide films 6 are formed on the grooves 3a, 3b, ... in which the polysilicon layers 5 are buried.

The element isolation in the above semiconductor integrated circuit is effected as follows.

First, the grooves 3a, 3b, ... surrounding the element regions 2 are formed in the silicon substrate 1 by an anisotropic etching technique. Then, a non-oxide film (Si$_3$N$_4$) such as a nitride film is formed on the element regions 2. After this, the oxide film 4 is formed on the field region and the internal surfaces of the grooves 3a, 3b, ... with the non-oxide film used as a mask. After formation of the oxide film 4, the polysilicon layers 5 are buried in the grooves 3a, 3b. .... Further, the polysilicon layers 5 are made flat and then the thin cap oxide films 6 are formed on the grooves.

In the integrated circuit thus formed, a distance $W_{TT}$ between the side wall of the groove 3a and the side wall of the groove 3b is designed to a minimum possible length in order to enhance the integration density of the elements.

However, it is generally known that as the distance between the grooves becomes shorter, thermal stress is more concentrated on the corner portions of the grooves 3a, 3b, ... in the oxidation process for forming the oxide films 4 on the field region and the internal surfaces of the grooves 3a, 3b, .... More specifically, as shown in FIG. 2, dislocation defects 9 may be caused in the upper corner portions 7 and bottom corner portions 8 because of the concentration of thermal stress at the time of oxidation. The dislocation defects 9 increase leak current between the collectors of transistors formed in the silicon substrate. Further, the transistor characteristic such as the $I_C$ (collector current)-$h_{FE}$ (grounded emitter current amplification factor) characteristic will be deteriorated. That is, if the dislocation defects 9 occur at a certain density, recombination current around the defect increases to deteriorate the element characteristic and element isolation characteristic, making the semiconductor device definitely impractical.

SUMMARY OF THE INVENTION

This invention has been made to solve the above problems, and an object of this invention is to provide a semiconductor device in which occurrence of dislocation defects in the upper and bottom corner portions of the element isolation grooves can be suppressed and deterioration of the element characteristic and the element isolation characteristic can be prevented.

In order to attain the above object, there is provided a semiconductor device in which a distance between a groove surrounding an element region and a groove surrounding another element region is set at least 3 μm so as to electrically isolate the former element region from the latter adjacent element region.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4A to 4C are cross sectional views showing a method of manufacturing the semiconductor device shown in FIG. 3;

FIG. 5 is a characteristic diagram showing the characteristic of the semiconductor device of the present invention.

DETAILED DESCRIPTION OF THE PREFERRED EMBODIMENTS

A semiconductor device according to one embodiment of the present invention and a method for manufacturing the same are explained in detail with reference to the accompanying drawings.

Figure 1:
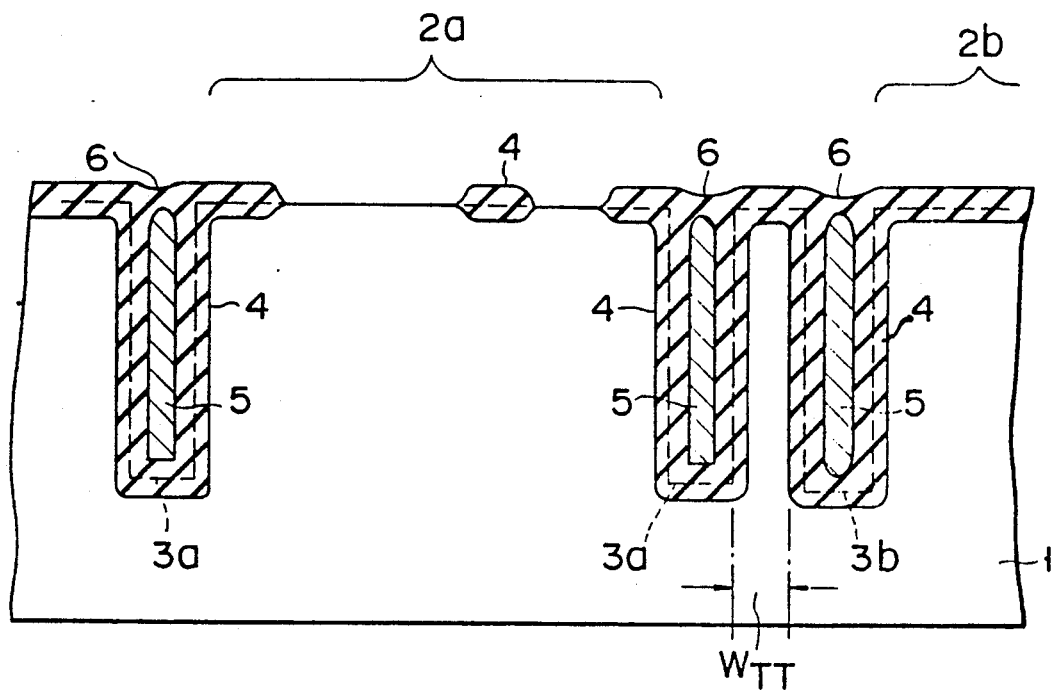
FIGS. 1 and 2 are cross sectional views each showing a conventional semiconductor device.
Figure 2:
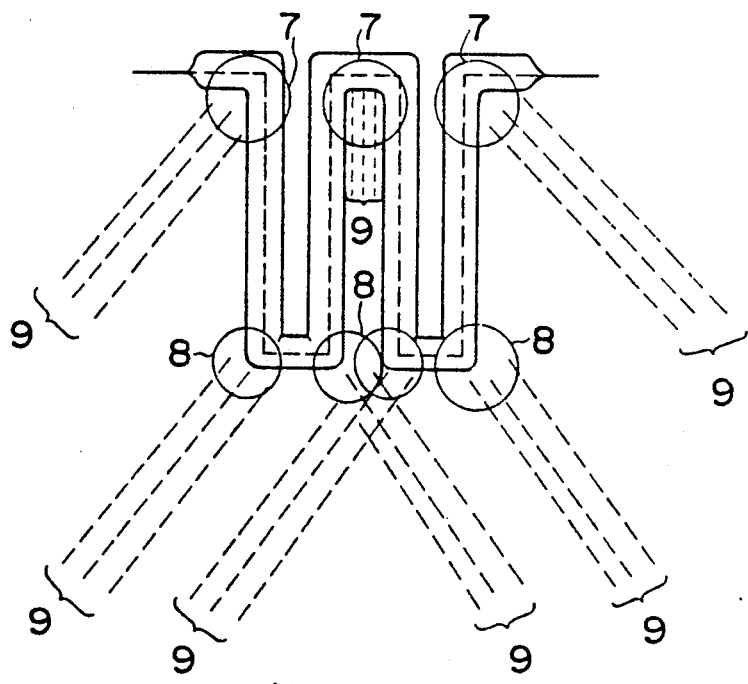
Figure 3:
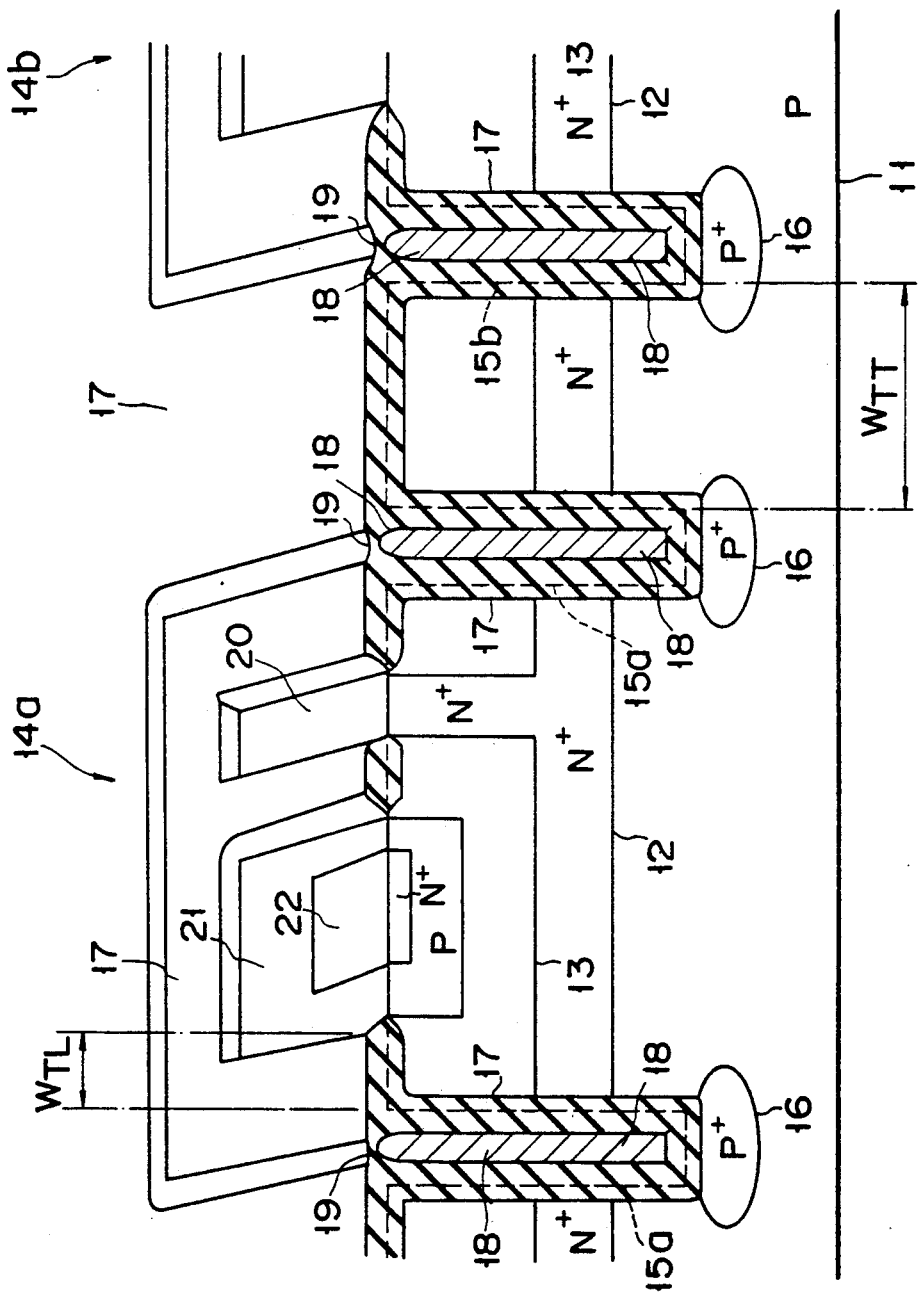
FIG. 3 is a perspective view showing a semiconductor device according to one embodiment of the present invention.

FIG. 3 shows a semiconductor device according to one embodiment of this invention. The semiconductor device has bipolar transistor arrays formed in element regions. That is, an N$^+$-type buried layer 12 is formed on a P-type monocrystalline silicon substrate 11. N-type epitaxial layers 13 are formed on the N$^+$-type buried layer 12. Element isolation grooves 15a, 15b, surrounding element regions 14a, 14b, ... are formed in the silicon substrate 11 and N-type epitaxial layers 13. p$^+$-type impurity regions 16 are formed on the bottom portions of the element isolation grooves 15a, 15b, . . . . An oxide film 17 is formed on a field region and the internal surfaces of the element isolation grooves 15a, 15b, . . . . Polysilicon layers 18 are buried in the element isolation grooves 15a, 15b, . . . on which the oxide film 17 is formed. Thin cap oxide films 19 are formed on the grooves 15a, 15b, . . . in which the polysilicon layers 18 are buried. Further, an N+-type collector lead-out region 20, P-type base region 21 and N+-type emitter region 22 are formed in the N-type epitaxial regions of the element regions 14a, 14b, . . . .

In the above semiconductor device, a $W_{TT}$ distance between the adjacent element regions 15a, 15b, . . . is set to 3 μm or more. Further, the width of the element isolation grooves 15a, 15b, . . . is set in the range of 1 to 2 μm. The oxide film 17 having a film thickness of not larger than 0.9 μm (9000 Å) is formed on the internal surfaces of the element isolation regions 15a, 15b.

With the above construction, occurrence of dislocation defects in the upper corner and bottom corner of the element isolation region can be suppressed and therefore the element characteristics and isolation characteristics will not be deteriorated.

FIGS. 4A to 4C show a method of manufacturing the semiconductor device shown in FIG. 3.

First, as shown in FIG. 4A, an $SiO_2$ film 23 is formed on the main surface of a monocrystalline silicon substrate 21 formed of a P-type substrate 21a, N+-type buried layer 21b and N-type epitaxial layer 21c by use of a CVD method or thermal oxidation method. Further, a resist pattern 24 is formed on the $SiO_2$ film 23. After this, the monocrystalline silicon substrate 21 is etched in a vertical direction by use of an RIE (reactive ion etching) method so as to form element isolation grooves 25a, 25b, . . . having a width of 1 to 2 μm and a depth of approx. 5 μm. Each of the element isolation grooves 25a, 25b, . . . is formed to surround a corresponding one of element regions 26a, 26b, . . . , and the element isolation grooves 25a, 25b, . . . are arranged so that a distance $W_{TT}$ between the adjacent two element isolation grooves may be set to be larger than 3 μm.

Next, as shown in FIG. 4B, the $SiO_2$ film 23 and the resist pattern 24 are removed. After this, thermal oxidation is effected in an $H_2$ and $O_2$ gas atmosphere at a temperature of approx. 950° C. to form an $SiO_2$ film 27 having a film thickness of approx. 500 Å. Further, an $Si_3N_4$ film 28 having a film thickness of approx. 1000 Å is formed by deposition at a temperature of approx. 780° C. by use of an LP-CVD method. Then, a resist pattern 29 is formed on the $Si_3N_4$ film 28 by a photo-etching technique. Next, the $Si_3N_4$ film 28 is selectively etched by a plasma-etching technique to leave the $Si_3N_4$ film (non-oxide film) 28 only in positions above the element regions 26a, 26b.

Next, as shown in FIG. 4C, the resist pattern 29 is removed. After this, wet oxidation is effected at a temperature of approx. 1000 Å with the $Si_3N_4$ film 28 used as a mask. As a result, an oxide film 30 having a film thickness of less than 9000 Å, for example, 8000 Å is formed on the field region and on the internal surface of the element isolation grooves 25a, 25b.

After this, polysilicon layers are buried into the element isolation grooves 25a, 25b, . . . by a well known manufacturing method, although not shown in the FIGS. After the polysilicon layers are made flat, thin cap oxide films are formed on the element isolation grooves 25a, 25b, . . . . Further, bipolar transistors are formed in the element regions 26a, 26b.

Now, the characteristic of the semiconductor device of this invention is explained with reference to FIG. 5.

Bipolar transistor arrays were formed with a distance $W_{TT}$ between the side wall of one of the element isolation grooves and the side wall of an adjacent one of the element isolation grooves used as a parameter. The distance $W_{TT}$ was set at four different values of 1.0, 2.0, 3.0 and 4.0 μm. The film thickness of the field oxide film was set at approx. 9000 Å and a distance $W_{TL}$ between the element isolation grooves 15a, 15b, . . . and the non-oxide films formed in the surface area of the substrate was set to approx. 3.0 μm.

The defects occurring in the upper corners and bottom corners of the element isolation grooves 15a, 15b, . . . , the stress applied to the surrounding portion of the element isolation grooves 15a, 15b, . . . at the normal temperature, and the density of leak current between the elements were selected as the items to be evaluated.

The defects were evaluated by etching off the entire substrate surface after the step of forming the elements and then effecting the Wright etching to selectively etch the defects. After this, the number of defects were counted by observation of the defects by use of an optical microscope and were expressed by the density of defects occurring for the length of 1 mm of the element isolation grooves 15a, 15b, . . . . The stress applied to the surrounding portion of the element isolation grooves 15a, 15b, . . . was measured by a laser Raman microspectroscopy and the maximum stresses applied to the bottom portions of the element isolation grooves 15a, 15b, . . . were expressed as the measurements. Further, the density of leak current between the cells was expressed as the current density when the application voltage was set at 12 V by using the I-V characteristic between the current and voltage between the collectors of the transistor cells.

In FIG. 5 in which the evaluated items are collectively shown, the abscissa indicates the distance $W_{TT}$ (μm) between the adjacent element isolation grooves, the ordinate (a) indicates the density (A/cm$^2$) of leak current flowing between the cells when a voltage of 12 V is applied between the elements, the ordinate (b) indicates the density of defects (/mm) in the upper corner and bottom corner, and the ordinate (c) indicates the stress (dyn/cm$^2$).

That is, when the distance $W_{TT}$ (μm) between the adjacent element isolation grooves is sequentially set to 4.0 m, 3.0 μm, 2.0 μm and 1.0 μm in this order, the stress basically increases and at the same time the defect density increases. The reason why the stress decreases near the point of 1.0 μm is that a large number of defects are caused by application of an extremely strong stress to reduce the stress. Further, as the distance $W_{TT}$ decreases, the density of leak current between the cells indicating the element isolation characteristic increases. As a result, it is proved that it is preferable to set the distance $W_{TT}$ between the adjacent element isolation grooves 15a, 15b, . . . to at least 3.0 μm in order to prevent the element characteristic and element isolation characteristic from being deteriorated.

Figure 6:
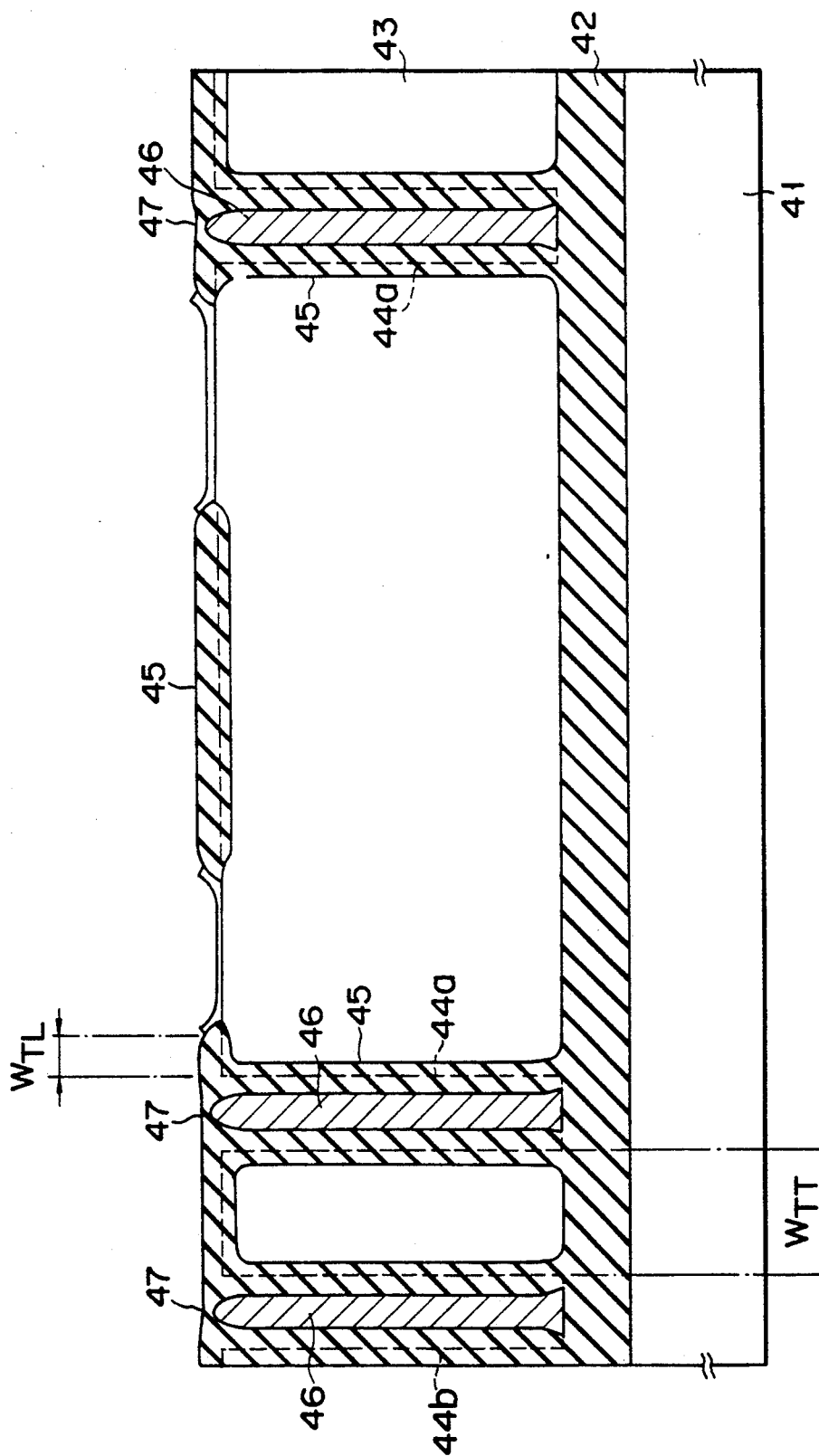
FIG. 6 is a cross sectional view showing a semiconductor device according to another embodiment of the present invention.

FIG. 6 shows a semiconductor device according to another embodiment of the present invention.

The semiconductor device uses a (Silicon-on-Insulator) or SOI wafer as a substrate. This wafer is formed by bonding two monocrystal silicon substrates. That is, an oxide film 42 is formed on a monocrystalline silicon substrate 41. Further, a monocrystalline silicon substrate 43 is formed on the oxide film 42. The monocrystalline silicon substrate 43 is polished to have a sufficiently small thickness, for example, a thickness of approx. 5 μm after it is bonded with the substrate 41. Element isolation grooves 44a, 44b, . . . are formed in the monocrystalline silicon substrate 43. Oxide films 45 are formed on the field region and the internal surface of the element isolation grooves 44a, 44b, . . . . Polysilicon layers 46 are buried in the element isolation grooves 44a, 44b, . . . on which the oxide films 45 are formed. Thin cap oxide films 47 are formed on the element isolation grooves 44a, 44b, . . . in which the polysilicon layers 46 are buried.

The distance $W_{TT}$ between the adjacent element isolation grooves 44a, 44b, . . . is set to at least 3.0 μm. Further, the oxide films 46 having a film thickness of not more than 0.9 μm (9000 Å) are formed on the internal surfaces of the element isolation grooves 44a, 44b, . . . having a width in the range of 1 to 2 μm.

With the above construction, occurrence of the dislocation defects in the upper corner and bottom corner of the element isolation groove can be suppressed, and at the same time, the element characteristics and isolation characteristics will not be deteriorated.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents..

What is claimed is:

1. A semiconductor device comprising:
    at least two element regions;
    a first groove, formed to surround a first one of said at least two element regions, with a first inner surface;
    a second groove, formed to surround a second one of said at least two element regions which is closest to said first one of said at least two element regions, with a second inner surface;
    a field region between said first and second ones of said at least two element regions;
    a first oxide film, formed on said first and second inner surfaces of said first and second grooves, with a first thickness; and
    a second oxide film, formed on said field region, with a second thickness,
    wherein said first thickness equals said second thickness, and a distance between said first groove and said second groove is set to be equal to or greater than 3 μm.

2. A semiconductor device according to claim 1, wherein said first and second oxide films have a film thickness of not greater than 9000 Å and are formed in each of said first and second grooves surrounding said first and second ones of said at least two element regions.

3. A semiconductor device according to claim 1, wherein a width of each of said first and second grooves surrounding said first and second ones of said at least two element regions is 1 to 2 μm.

4. A semiconductor device according to claim 1, wherein said at least two element regions are formed in a wafer having a silicon-on-insulator structure.

5. A semiconductor device according to claim 1, wherein bipolar transistors are formed in said at least two element regions.

6. A semiconductor device according to claim 1, wherein a polysilicon layer is buried in each of said first and second grooves surrounding said first and second ones of said at least two element regions.

* * * * *